US007826248B2

(12) United States Patent
Xi et al.

(10) Patent No.: US 7,826,248 B2
(45) Date of Patent: Nov. 2, 2010

(54) WRITE VERIFY METHOD FOR RESISTIVE RANDOM ACCESS MEMORY

(75) Inventors: Haiwen Xi, Prior Lake, MN (US); Song S. Xue, Edina, MN (US)

(73) Assignee: Seagate Technology LLC, Scotts Valley, CA (US)

(*) Notice: Subject to any disclaimer, the term of this patent is extended or adjusted under 35 U.S.C. 154(b) by 378 days.

(21) Appl. No.: 12/123,647

(22) Filed: May 20, 2008

(65) Prior Publication Data

US 2009/0290411 A1    Nov. 26, 2009

(51) Int. Cl.
G11C 11/00 (2006.01)
(52) U.S. Cl. ............... 365/148; 365/145; 365/151; 365/163
(58) Field of Classification Search ............ 365/148, 365/151, 163
See application file for complete search history.

(56) References Cited

U.S. PATENT DOCUMENTS

| 2006/0097288 | A1  | 5/2006 | Baek          |         |
|--------------|-----|--------|---------------|---------|
| 2007/0159867 | A1* | 7/2007 | Muraoka et al.| 365/100 |
| 2007/0195590 | A1  | 8/2007 | Sugita        |         |
| 2007/0217084 | A1  | 9/2007 | Xue           |         |
| 2008/0123389 | A1* | 5/2008 | Cho et al.    | 365/148 |
| 2008/0212359 | A1* | 9/2008 | Muraoka et al.| 365/148 |

FOREIGN PATENT DOCUMENTS

EP    1 418 592    5/2004
EP    1 426 975    6/2004

OTHER PUBLICATIONS

PCT Search Report and Written Opinion dated Jun. 24, 2009.
Baek et al., Multi-Layer Cross-Point Binary Oxide Resistive Memory (OxRRAM) for Post-NAND Storage Application, 2005 IEEE.
Kozicki, et al., Non-Volatile Memory Based on Solid Electrolytes, Center for Solid State Electronics Research, Arizona State University.

(Continued)

*Primary Examiner*—Pho M Luu
*Assistant Examiner*—Tha-O Bui
(74) *Attorney, Agent, or Firm*—Campbell Nelson Whipps LLC

(57) ABSTRACT

Write verify methods for resistance random access memory (RRAM) are provided. The methods include applying a reset operation voltage pulse across a RRAM cell to change a resistance of the RRAM cell from a low resistance state to a high resistance state and setting a counter to zero. Then the method includes applying a forward resetting voltage pulse across the RRAM cell if the RRAM cell has a high resistance state resistance value less than a selected lower resistance limit value and adding one to the counter. This step is repeated until either the counter reaches a predetermined number or until the high resistance state resistance value is greater than the lower resistance limit value. The method also includes applying a reverse resetting voltage pulse across the RRAM cell if the RRAM cell has a high resistance state resistance values is greater than a selected upper resistance limit value and adding one to the counter. The reverse resetting voltage pulse has a second polarity being opposite the first polarity. This step is repeated until either the counter reaches a predetermined number or until all the high resistance state resistance value is less than the upper resistance limit value.

20 Claims, 7 Drawing Sheets

OTHER PUBLICATIONS

Baikalov, et al., Field-Driven Hystertic and Reversible Resistive Switch . . . , Appl. Phys. Lett. 83, 957 (2003).

Fujii et al., Hysteretic Current-Voltage Characteristics and Resitance Switching . . . , Appl. Phys. Lett. 86, 012107 (2005).

Rozenberg, et al., Nonvolatile Memory with Multilevel Switching: A Basic Model, Physical Review Letters, vol. 92, No. 17, pp. 178302-1-178302-4.

* cited by examiner

WRITE VERIFY METHOD FOR RESISTIVE RANDOM ACCESS MEMORY

BACKGROUND

Nonvolatile memory is a type of memory that retains stored data when power is removed from the memory. Thus, nonvolatile memory devices are being widely employed in computers, mobile communication terminals, memory cards, and the like. There are various types of nonvolatile memories including e.g., flash memory.

A flash memory device is commonly used as a nonvolatile memory device. In general, the flash memory device includes memory cells, each of which has a stacked gate structure. The stacked gate structure may include a tunnel oxide layer, a floating gate, an inter-gate dielectric layer, and a control gate electrode, which are sequentially stacked on a channel region.

Recently, new nonvolatile memory devices, such as a resistance random access memory (RRAM), have been proposed. A unit cell of the RRAM includes a data storage element which has two electrodes and a variable resistive material layer interposed between the two electrodes. The variable resistive material layer, i.e., a data storage material layer, has a reversible variation in resistance according to the polarity and/or magnitude of an electric signal (voltage or current) applied between the electrodes.

While RRAM appears to be a promising nonvolatile memory, there are a number of challenges with RRAM. One illustrative challenge is that the distribution of the write pulse and of the cell resistance for an RRAM memory array appears to be wide, which results in difficulty in writing and reading the RRAM memory array.

BRIEF SUMMARY

The present disclosure relates to a write verify method for resistive random access memory (RRAM). In particular, the methods described herein narrow the memory cell resistance distribution, improving readability of the RRAM cell. These methods can be utilized on both single-bit and multi-bit RRAM cells.

In one particular embodiment, a write verify method for resistance random access memory (RRAM) includes applying a reset operation voltage pulse across a RRAM cell to change a resistance of the RRAM cell from a low resistance state to a high resistance state. The high resistance state has a range of resistance values and the reset operation voltage pulse has a first polarity. The method then includes selecting a lower resistance limit value and an upper resistance limit value. The lower resistance limit value and the upper resistance limit value are within the range of resistance values and form a narrowed range of resistance values for the high resistance state. Then the method includes applying a forward resetting voltage pulse across the RRAM cell if any of the range of high resistance state resistance values is less than the lower resistance limit value. The forward resetting voltage pulse has the first polarity, and this step is repeated until either a predetermined number of pulses is applied or until all of the range of high resistance state resistance values are greater than the lower resistance limit value. The method can also include applying a reverse resetting voltage pulse across the RRAM cell if any of the range of high resistance state resistance values is greater than the upper resistance limit value. The reverse resetting voltage pulse has a second polarity being opposite the first polarity and repeating this step until either a predetermined number of pulses is applied or until all of the range of high resistance state resistance values are less than the upper resistance limit value. Utilizing a look-up table, this method can be applied to a multi-bit RRAM cell.

In another particular embodiment, a write verify method include applying a reset operation voltage pulse across a RRAM cell to change a resistance of the RRAM cell from a low resistance state to a high resistance state and setting a counter to zero. Then the method includes applying a forward resetting voltage pulse across the RRAM cell if the RRAM cell has a high resistance state resistance value less than a selected lower resistance limit value and adding one to the counter. This step is repeated until either the counter reaches a predetermined number or until the high resistance state resistance value is greater than the lower resistance limit value. The method also includes applying a reverse resetting voltage pulse across the RRAM cell if the RRAM cell has a high resistance state resistance values is greater than a selected upper resistance limit value and adding one to the counter. The reverse resetting voltage pulse has a second polarity being opposite the first polarity. This step is repeated until either the counter reaches a predetermined number or until all the high resistance state resistance value is less than the upper resistance limit value.

BRIEF DESCRIPTION OF THE DRAWINGS

The disclosure may be more completely understood in consideration of the following detailed description of various embodiments of the invention in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a write verify method for resistive random access memory (RRAM). In particular, the methods described herein narrow the memory cell resistance distribution, improving readability of the RRAM cell. These methods can be utilized on both single-bit and multi-bit RRAM cells. RRAM utilizes the electrical pulse induced resistance change effect to change the resistance (i.e., data state) of the memory from a high resistance state to a low resistance state, for example. The methods described herein trim the resistance distribution of the high resistance state(s), separating the low resistance state resistance value and high resistance state value(s), thus improving the readability of the RRAM cell. While the present invention is not so limited, an appreciation of various aspects of the invention will be gained through a discussion of the examples provided below.

Figure 1:
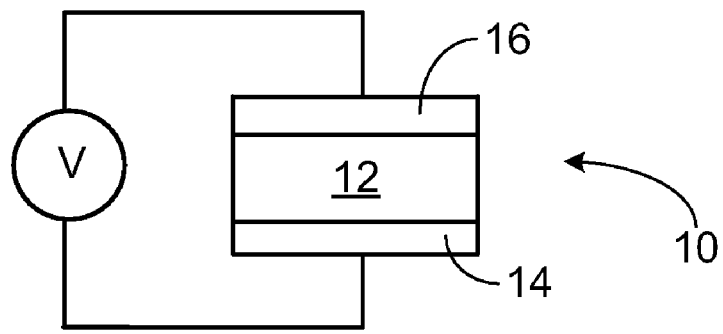
FIG. 1 is a schematic diagram of an illustrative resistive random access memory cell.
Figure 2:
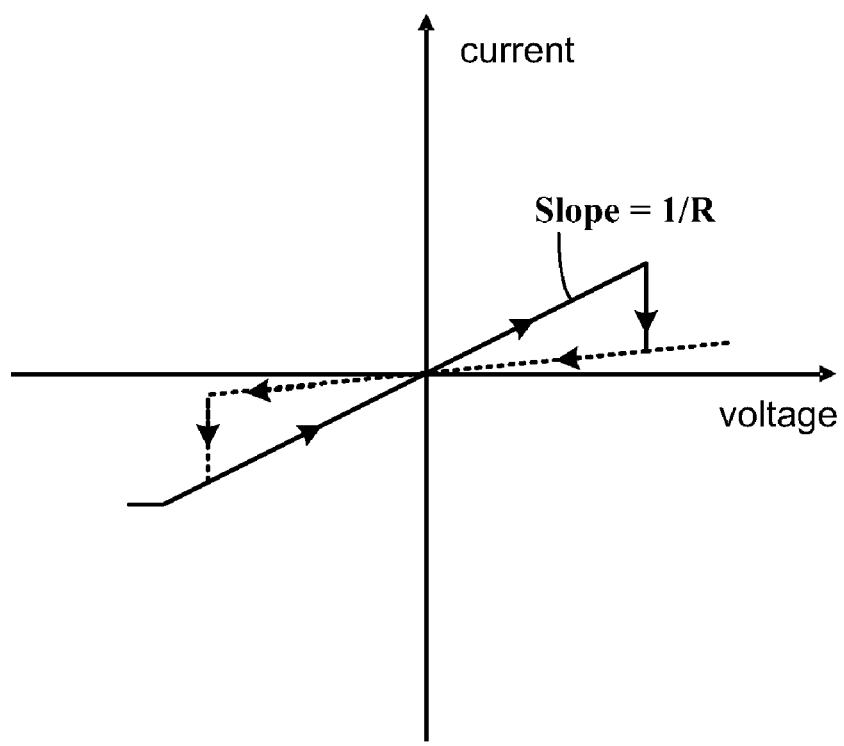
FIG. 2 is a graph of an exemplary hysteretic resistance change for the illustrative resistive random access memory cell of FIG. 1.

FIG. 1 is a schematic diagram of an illustrative resistive random access memory (RRAM) cell 10. FIG. 2 is a graph of an exemplary hysteretic resistance change for the illustrative resistive random access memory cell 10 of FIG. 1 due to the electrical pulse induced resistance change effect. The RRAM cell 10 includes a medium layer 12 that responds to an electrical current or voltage pulse by altering an electrical resistance of the medium layer 12. This phenomenon can be referred to as the electrical pulse induced resistance change effect. This effect changes the resistance (i.e., data state) of the memory from a one or more high resistance state(s) to a low resistance state, for example. The medium layer 12 is interposed between a first electrode 14 and a second electrode 16 and acts as a data storage material layer of the RRAM cell. The first electrode 14 and a second electrode 16 are electrically connected to a voltage source V. The first electrode 14 and a second electrode 16 can be formed of any useful electrically conducting material such as, for example, a metal.

The material forming the medium layer 12 can be any known useful RRAM material. In some embodiments, the material forming the medium layer 12 includes an oxide material such as, for example, a metal oxide. In some embodiments, the metal oxide is a binary oxide material or complex metal oxide material. In other embodiments, the material forming the medium layer 12 includes a chalcogenide solid electrolyte material or an organic/polymer material.

The binary metal oxide material can be expressed as a chemical formula of $M_xO_y$. In this formula, the characters "M", "O", "x", and "y" refer to metal, oxygen, a metal composition ratio, and an oxygen composition ratio, respectively. The metal "M" may be a transition metal and/or aluminum (Al). In this case, the transition metal may be nickel (Ni), niobium (Nb), titanium (Ti), zirconium (Zr), hafnium (Hf), cobalt (Co), iron (Fe), copper (Cu) and/or chrome (Cr). Specific examples of binary metal oxides that may be used as the medium layer 12 include CuO, NiO, CoO, ZnO, $CrO_2$, $TiO_2$, $HfO_2$, $ZrO_2$, $Fe_2O_3$, and $Nb_2O_5$.

In some embodiments, the metal oxide can be any useful complex metal oxide such as, for example, a complex oxide material having a formula $Pr_{0.7}Ca_{0.3}MnO_3$, or $SrTiO_3$, or $SiZrO_3$, or these oxides doped with Cr or Nb. The complex can also include $LaCuO_4$, or $Bi_2Sr_2CaCu_2O_8$. One example of a solid chalcogenide material is a germanium-selenide ($Ge_xSe_{100-x}$) containing a silver (Ag) component. One example of an organic material is Poly(3,4-ethylenedioxythiophene) (i.e., PEDOT).

The exemplary RRAM cell 10 medium layer 12 has a reversible variation in resistance, which can be sensed at a voltage of, for example less than 4 V, or less than 3 V or less than 2 V. A plurality of RRAM cells 10 can be configured in an array to form the memory device. The exemplary RRAM cell 10 can be fabricated utilizing conventional semiconductor fabrication techniques. The hardware implementations of this method is not particularly limited in order to obtain a control unit that is able to perform the correct and proper sequence described by the method herein. For example, one approach includes a sequencer and a finite state machine.

For convenience, the set operation is defined as the change from the high resistance state (HRS) to the low resistance state (LRS). The reset operation is defined as the change from the LRS to the HRS. It has been observed that that the RRAM cell resistance can be changed or altered after the set operation and particularly after the reset operation.

Figure 3:
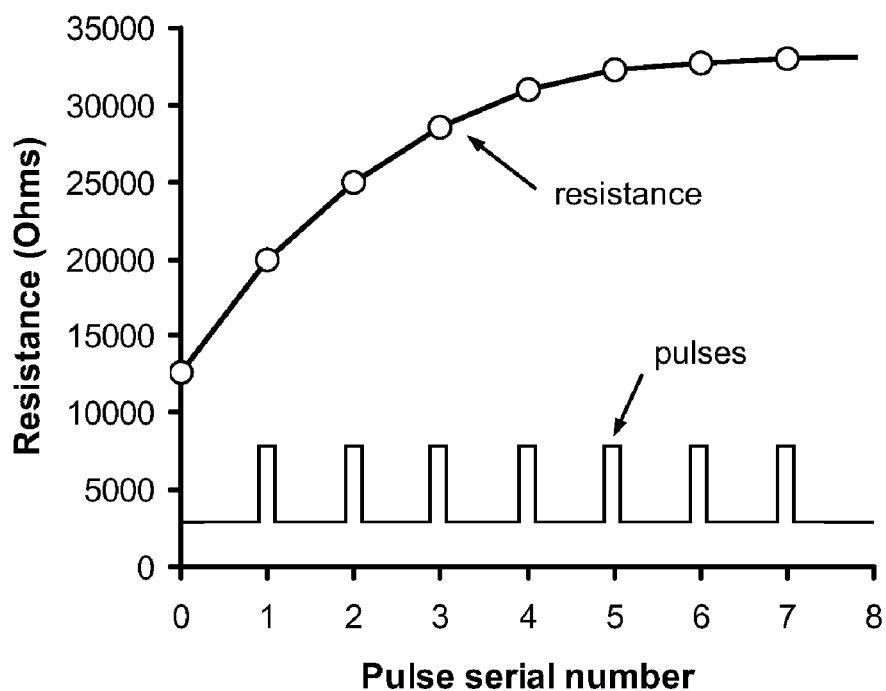
FIG. 3 is a graph showing a high resistance state resistance increase for the illustrative resistive random access memory cell of FIG. 1 with consecutive forward resetting voltage pulses.
Figure 4:
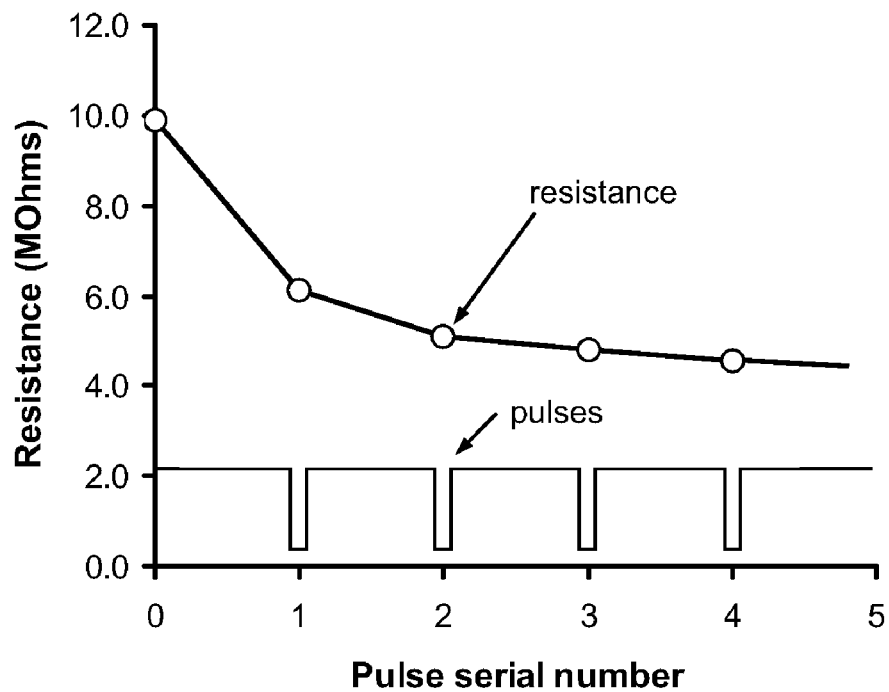
FIG. 4 is a graph showing a high resistance state resistance decrease for the illustrative resistive random access memory cell of FIG. 1 with consecutive reverse resetting voltage pulses.

FIG. 3 is a graph showing a high resistance state (HRS) resistance increase for the illustrative resistive random access memory (RRAM) cell of FIG. 1 with consecutive forward resetting voltage pulses. FIG. 4 is a graph showing a high resistance state (HRS) resistance decrease for the illustrative (RRAM) cell of FIG. 1 with consecutive reverse resetting voltage pulses. The reverse resetting voltage pulses are the polarity opposite to that of the reset pulse. Utilizing these effects the design of a write verify method is described below providing for improved RRAM memory performance.

Figure 5:
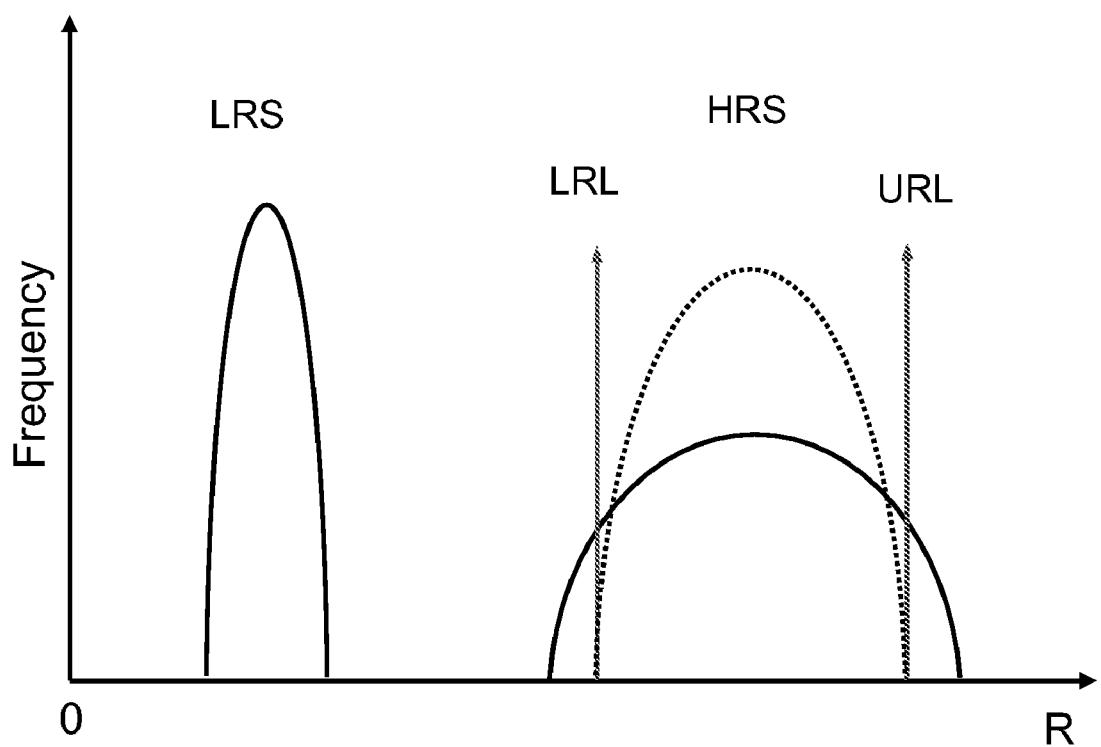
FIG. 5 is a graph of exemplary low resistance state and high resistance state distributions for the illustrative resistive random access memory cell of FIG. 1.

FIG. 5 is a graph of exemplary low resistance state (LRS) and high resistance state (HRS) distributions for the illustrative resistive random access memory cell of FIG. 1. The solid curves show typical cell resistance distributions of the LRS and HRS after a single-shot voltage pulsing set and reset operation across the RRAM cell. The separation between the LRS distribution and the HRS distribution is one factor that determines the readability of the RRAM cell. The larger the separation between the LRS distribution and the HRS distribution, the better the readability of the RRAM cell. As illustrated in FIG. 5, the HRS distribution is usually broader or larger then the LRS distribution. The write verify methods described herein operate to narrow the HRS distribution to be within a predetermined lower resistance limit (LRL) and an upper resistance limit (URL) (represented by the two standing arrows in FIG. 5) and/or increase the separation between the LRS distribution and the HRS distribution.

The write verify method for resistance random access memory (RRAM) includes applying a reset operation voltage pulse across a RRAM array. The reset operation voltage pulse changing a resistance of the RRAM array from a LRS to a HRS. The HRS having a range of resistance values. The reset operation voltage pulse having a first polarity. Then a lower resistance limit (LRL) value and an upper resistance limit (URL) value (or associated voltages) are selected, in some embodiments, from a look-up table. The LRL value and the URL value are within the range of resistance values and form a narrowed range of resistance values for the HRS. Then a forward resetting voltage pulse is applied across the RRAM array if any of the range of HRS resistance values is less than the LRL value. The forward resetting voltage pulse has the first polarity. Then the forward resetting voltage pulses step is repeated until either a predetermined number of pulses is applied or until all of the range of HRS resistance values are greater than the LRL value. This step increases the separation between the LRS and the HRS.

The method can further include applying a reverse resetting voltage pulse across the RRAM array if any of the range of HRS resistance values is greater than the URL value. The reverse resetting voltage pulse has a second polarity that is opposite the first polarity of the forward resetting voltage pulse. Then the reverse resetting voltage pulse is repeated until either a predetermined number of pulses is applied or until all of the range of HRS resistance values are less than the URL value. The forward and reverse resetting voltage pulse described herein can have any useful value such as, of example, less than 3.3V, or less than 2.2 V, or less than 1.8 V, or less than 1.5 V, or less than 1 V.

Figure 6:
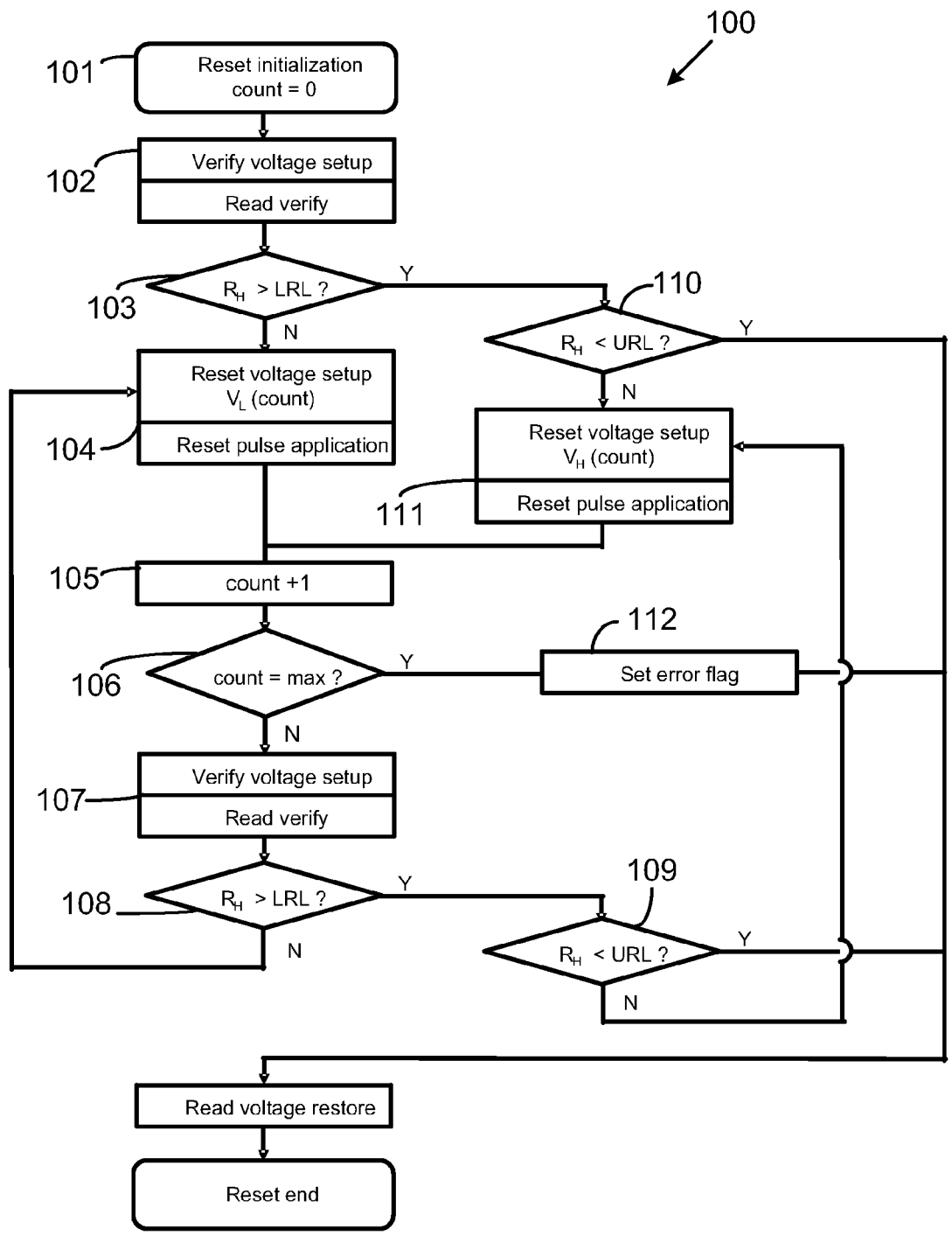
FIG. 6 is a flowchart of an illustrative write verify method for the illustrative resistive random access memory cell of FIG. 1.

FIG. 6 is a flowchart 100 of one illustrative write verify method. As described above, instead of a single-shot reset (i.e., write) voltage pulse, a series of voltage pulses are utilized. First the reset is initialized and a counter is set to zero at block 101, then the RRAM cell is verified for resistance at block 102. If (decision block 103) the resistance $R_H$ is already greater than the LRL, and (decision block 110) less than the URL, then there is no need to reset and the cell exists from the write process. Otherwise a voltage pulse is applied to the RRAM cell to change the resistance and the counter in incremented by one at block 105. A forward resetting voltage pulse is applied at block 104 if $R_H$ is less than the LRL, and a reverse resetting voltage pulse is applied at block 111 if $R_H$ is greater than the URL.

If (decision block 106) the counter value is equal to a determined maximum counter value then the RRAM cell is assigned an error flag and exits the write process. Otherwise the RRAM cell is verified for resistance at block 107, and if (decision block 108) the resistance $R_H$ is greater than the LRL, and (decision block 109) less than the URL, then there is no need for further reset and the cell exists from the write process. Otherwise a voltage pulse is applied to the RRAM cell to change the resistance and the counter in incremented by one at block 105. A forward resetting voltage pulse $V_L$ is applied at block 104 if $R_H$ is less than the LRL, and a reverse resetting voltage pulse $V_H$ is applied at block 111 if $R_H$ is greater than the URL. The cell continues through this method until either the counter reaches the maximum counter value (assigned an error flag and exits the write process) or exits the write process once the resistance $R_H$ is greater than the LRL and less than the URL. In many embodiments, this write verify method produces a HRS distribution that is narrowed by at least 5%, or at least 10%, or at least 20%, or at least 30%, or at least 50%.

The voltage pulse height (i.e., magnitude) and polarity can depend on a comparison of the verified resistance to the LRL, and LRL and the count. When the resistance is lower than the LRL, the forward resetting voltage pulse $V_L$ to be applied is with the same polarity of the initial reset pulse. When the resistance is higher than the URL, the reverse resetting voltage pulse $V_H$ to be applied the opposite polarity of the initial reset pulse. In many embodiments, a voltage step-down scheme is utilized, where the voltage magnitude (i.e., voltage level) and/or the applied voltage pulse duration is less than a prior voltage pulse magnitude (i.e., voltage level) and/or the applied voltage pulse duration. An example of this step-down scheme is illustrated in FIG. 7.

Figure 7:
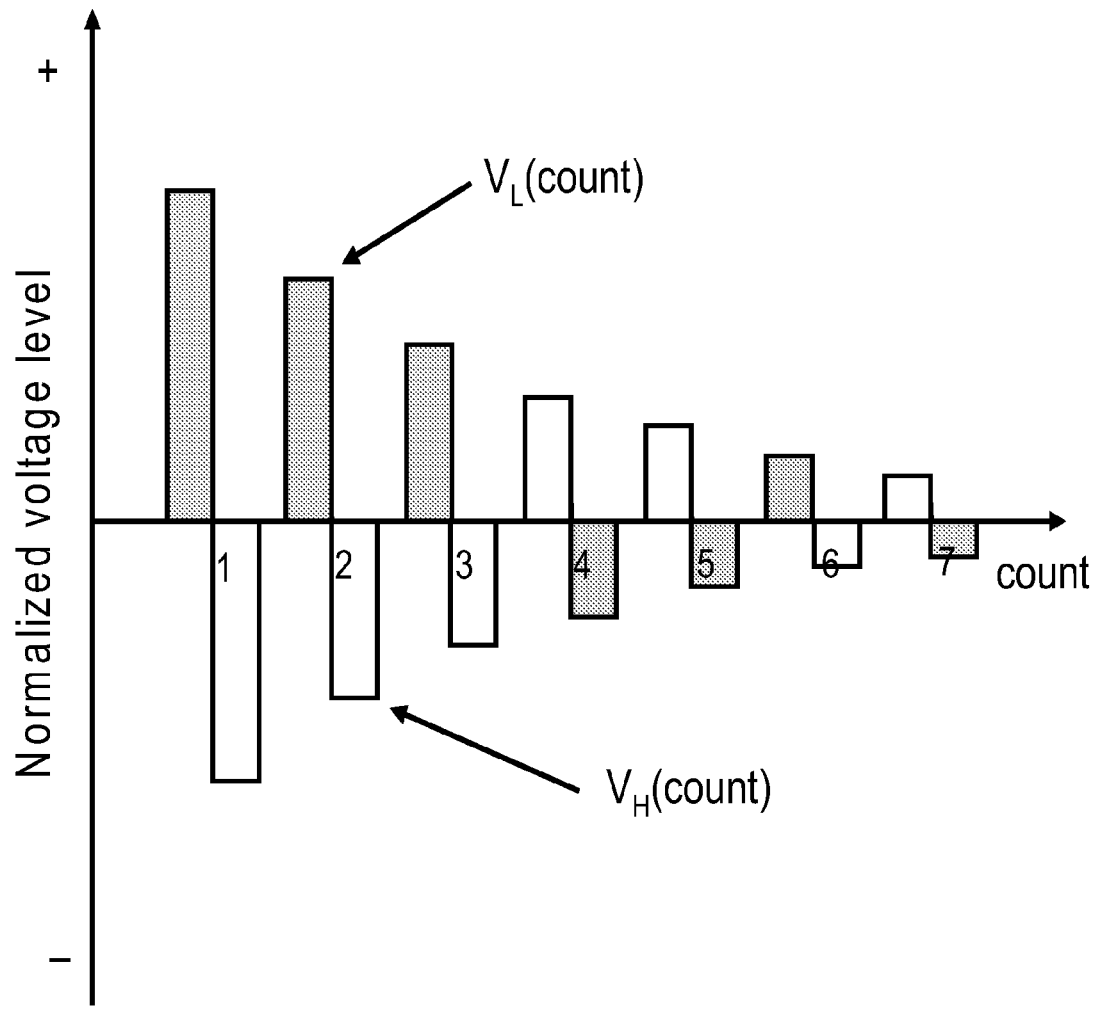
FIG. 7 is a graph of an exemplary forward and reverse resetting voltage pulse set for the illustrative resistive random access memory cell of FIG. 1 utilizing the write verify method shown in FIG. 6.

FIG. 7 is a graph of an exemplary forward and reverse resetting voltage pulse set for the illustrative resistive random access memory cell of FIG. 1 utilizing the write verify method shown in FIG. 6. This graph shows seven pulses applied to the RRAM cell in a step-down scheme. In this example, the voltage pulses for each count is shaded. Thus, the scheme produced the following write verify pulse sequence: $V_L(1), V_L(2), V_L(3), V_H(4), V_H(5), V_L(6), V_H(7)$.

Figure 8:
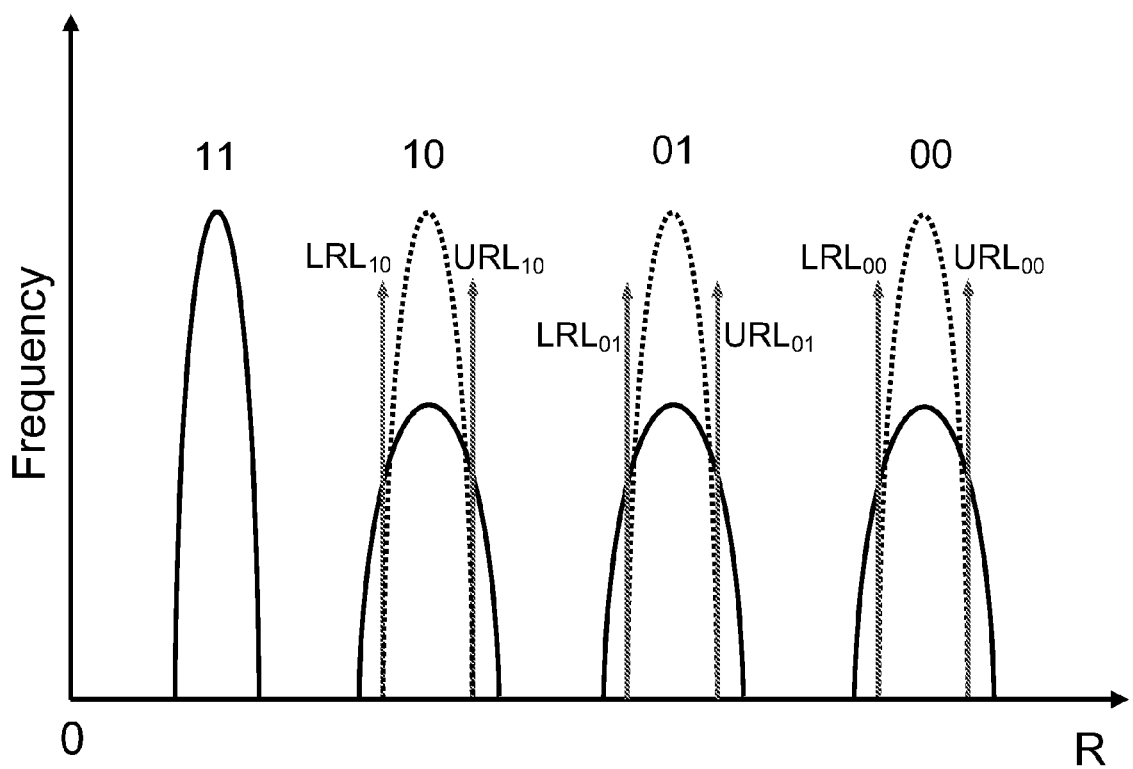
FIG. 8 is a graph of exemplary low resistance state and high resistance states distribution for an illustrative multi-bit resistive random access memory cell.

FIG. 8 is a graph of exemplary low resistance state (11) distribution and three high resistance state (10, 01, 00) distributions for an illustrative dual-bit resistive random access memory cell. The solid curves show typical cell resistance distributions of the 11 low resistance state and 10, 01, 00 high resistance states after a single-shot voltage pulsing set and reset operation (for each high resistance state) across the dual-bit RRAM cell. The four resistance states can have any useful mean resistance value. In one embodiment, the low resistance state (11) is 1 KOhm, the three high resistance states (10, 01, 00) are 10 KOhm, 100 KOhm, and 1000 KOhm, respectively.

The separation between each resistance state (11, 10, 01, 00) distribution is one factor that determines the readability of the dual-bit RRAM cell. The larger the separation between each resistance state (11, 10, 01, 00), the better the readability of the dual-bit RRAM cell. As illustrated in FIG. 8, the 10, 01, 00 high resistance state distributions are usually broader or larger then the 11 distribution. Even among the high resistance state distributions there may be variance, but the three high resistance state distributions are shown to the in FIG. 8 for illustrative purposes.

The write verify methods described herein operate to narrow the 10, 01, 00 high resistance state distributions to be within a predetermined lower resistance limit (LRL) and an upper resistance limit (URL) for each 10, 01, 00 high resistance state distributions (represented by the two standing arrows in FIG. 8). $LRL_{10}$ and $URL_{10}$ provide a narrowed resistance distribution for data state 10. $LRL_{01}$, and $URL_{01}$ provide a narrowed resistance distribution for data state 01. $LRL_{00}$ and $URL_{00}$ provide a narrowed resistance distribution for data state 00.

Figure 9:
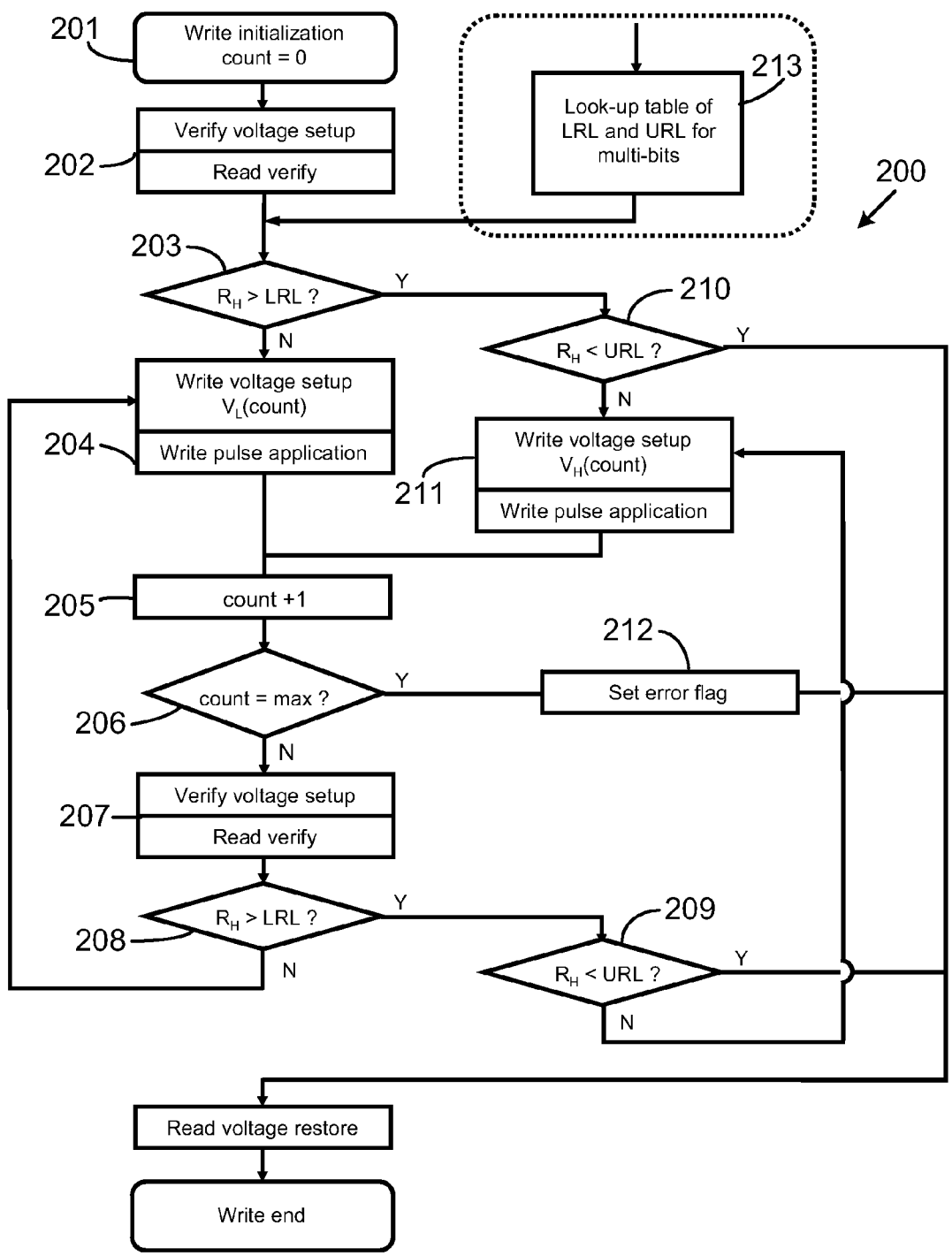
FIG. 9 is a flowchart of an illustrative write verify method for an illustrative multi-bit resistive random access memory cell.

FIG. 9 is a flowchart 200 of an illustrative write verify method for an illustrative multi-bit resistive random access memory cell. As described above, instead of a single-shot reset (i.e., write) voltage pulse, a series of voltage pulses are utilized for each high resistance state 10, 01, 00. The idea is similar to the flowchart described above with the added step of including a look-up table to determine each lower resistance limit (LRL) and upper resistance limit (URL) for each high resistance state 10, 01, 00. The look-up table can specify any useful lower resistance limit (LRL) and upper resistance limit (URL) for each high resistance state 10, 01, 00. For example, the look-up table for the 10 state can have a $LRL_{10}$ value of 9.9 KOhm and a $URL_{10}$ of 10.1 KOhm, and the 01 state can have a $LRL_{01}$ value of 99.0 KOhm and a $URL_{01}$ of 101.0 KOhm, the 00 state can have a $LRL_{00}$ value of 990 KOhm and a $URL_{00}$ of 1010 KOhm.

Each high resistance state 10, 01, 00 is separately subjected to the write verify method as described below. Only the 10 high resistance state is described, however it is understood that the 01 and 00 high resistance states would also be sequentially subjected to the write verify method as described below.

The reset is initialized and a counter is set to zero at block 201, then the multi-bit RRAM cell is verified for resistance at block 202. If (decision block 203) the resistance $R_H$ for high resistance state 10 is already greater than the $LRL_{10}$, and (decision block 210) less than the $URL_{10}$, then there is no need to reset and the cell exists from the write process and proceeds to write verify the next high resistance state (either 01 or 00). Otherwise a voltage pulse is applied to the multi-bit RRAM cell to change the resistance and the counter in incremented by one at block 205. A forward resetting voltage pulse is applied at block 204 if $R_H$ is less than the $LRL_{10}$, and a reverse resetting voltage pulse is applied at block 211 if $R_H$ is greater than the $URL_{10}$.

If (decision block 206) the counter value is equal to a determined maximum counter value then the multi-bit RRAM cell is assigned an error flag and exits the write process. Otherwise the multi-bit RRAM cell is verified for resistance at block 207, and if (decision block 208) the resistance $R_H$ is greater than the $LRL_{10}$, and (decision block 209) less than the $URL_{10}$, then there is no need for further reset and the cell exists from the write process. Otherwise a voltage pulse is applied to the multi-bit RRAM cell to change the resistance and the counter in incremented by one at block 205. A forward resetting voltage pulse $V_L$ is applied at block 204 if $R_H$ is less than the $LRL_{10}$, and a reverse resetting voltage pulse $V_H$ is applied at block 211 if $R_H$ is greater than the $URL_{10}$. The cell continues through this method until either the counter reaches the maximum counter value (assigned an error flag and exits the write process) or exits the write process once the resistance $R_H$ is greater than the $LRL_{10}$ and less than the $URL_{10}$. In many embodiments, this write verify method produces a high resistance state distributions that are narrowed by at least 5%, or at least 10%, or at least 20%, or at least 30%, or at least 50%.

For each high resistance state, the voltage pulse height and polarity can depend on a comparison of the verified resistance to the LRL and LRL for the selected data state and the count. When the resistance is lower than the LRL for the selected data state, the forward resetting voltage pulse $V_L$ to be applied is with the same polarity of the initial reset pulse. When the resistance is higher than the URL for the selected data state, the reverse resetting voltage pulse $V_H$ to be applied the opposite polarity of the initial reset pulse. In many embodiments, a voltage step-down scheme is utilized, where the voltage magnitude (i.e., voltage level) and/or the applied voltage pulse duration is less than a prior voltage pulse magnitude (i.e., voltage level) and/or the applied voltage pulse duration.

Thus, embodiments of the WRITE VERIFY METHOD FOR RESISTIVE RANDOM ACCESS MEMORY are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A write verify method for resistance random access memory (RRAM), the method comprising:

applying a reset operation voltage pulse across a RRAM cell, the reset operation voltage pulse changing a resistance of the RRAM cell from a low resistance state to a high resistance state, the high resistance state having a range of resistance values, the reset operation voltage pulse having a first polarity;

selecting a lower resistance limit value and an upper resistance limit value, where the lower resistance limit value and the upper resistance limit value are within the range of resistance values and form a narrowed range of resistance values for the high resistance state;

applying a forward resetting voltage pulse across the RRAM cell if any of the range of high resistance state resistance values is less than the lower resistance limit value, the forward resetting voltage pulse having the first polarity, repeating the applying one or more forward resetting voltage pulses step until either a predetermined number of pulses is applied or until all of the range of high resistance state resistance values are greater than the lower resistance limit value; and applying a reverse resetting voltage pulse across the RRAM cell if any of the range of high resistance state resistance values is greater than the upper resistance limit value, the reverse resetting voltage pulse having a second polarity being opposite the first polarity, repeating the applying one or more reverse resetting voltage pulses step until either a predetermined number of pulses is applied or until all of the range of high resistance state resistance values are less than the upper resistance limit value.

2. A method according to claim 1, wherein each successive forward resetting voltage pulse has a lower voltage level than a preceding pulse.

3. A method according to claim 1, wherein each successive forward resetting voltage pulse has a lower voltage duration than a preceding pulse.

4. A method according to claim 1, wherein each successive reverse resetting voltage pulse has a lower voltage level than a preceding pulse.

5. A method according to claim 1, wherein each successive reverse resetting voltage pulse has a lower voltage duration than a preceding pulse.

6. A method according to claim 1, wherein the selecting step comprises selecting a lower resistance limit value and an upper resistance limit value from a look-up table.

7. A method according to claim 1, wherein the applying one or more forward resetting voltage pulses across the RRAM cell and applying one or more reverse resetting voltage pulses across the RRAM cell forms an at least 10% narrower range of resistance values for the high resistance state.

8. A method according to claim 1, wherein the RRAM comprises a plurality of RRAM cells having a resistive switching medium comprising metal oxides.

9. A method according to claim 1, wherein the applying one or more forward resetting voltage pulses across the RRAM cell increases a separation between a low resistance state and the high resistance state of the RRAM cell.

10. A method according to claim 1, wherein the applying a reverse resetting voltage pulse across the RRAM cell step occurs before the applying a forward resetting voltage pulse across the RRAM cell step.

11. A write verify method for multi-bit resistance random access memory (RRAM), the method comprising:

applying a reset operation voltage pulse across a multi-bit RRAM cell, the reset operation voltage pulse changing a resistance of the RRAM cell from a low resistance state to a first high resistance state, the first high resistance state having a first range of resistance values, the reset operation voltage pulse having a first polarity;

selecting a first lower resistance limit value and a first upper resistance limit value for a first high resistance state of the multi-bit RRAM cell, where the first lower resistance limit value and the first upper resistance limit value are within the first range of resistance values and form a first narrowed range of resistance values for the first high resistance state;

applying a forward resetting voltage pulse across the RRAM cell if any of the range of first high resistance state resistance values is less than the first lower resistance limit value, the forward resetting voltage pulse having the first polarity, repeating the applying one or more forward resetting voltage pulses step until either a predetermined number of pulses is applied or until all of the first range of high resistance state resistance values are greater than the first lower resistance limit value;

applying a reverse resetting voltage pulse across the RRAM cell if any of the first range of high resistance state resistance values is greater than the first upper resistance limit value, the reverse resetting voltage pulse having a second polarity being opposite the first polarity, repeating the applying one or more reverse resetting voltage pulses step until either a predetermined number of pulses is applied or until all of the first range of high resistance state resistance values are less than the first upper resistance limit value; and repeating the applying a reset operation voltage pulse step, and the selecting step, and applying a forward resetting voltage pulse step, and applying a reverse resetting voltage pulse for each remaining high resistance state of the multi-bit.

12. A method according to claim 11, wherein the selecting step comprises selecting a lower resistance limit value and an upper resistance limit value from a look-up table for each high resistance state of the multi-bit RRAM cell.

13. A method according to claim 11, wherein each successive forward resetting voltage pulse has a lower voltage level or a lower voltage duration than a preceding pulse.

14. A method according to claim 11, wherein each successive reverse resetting voltage pulse has a lower voltage level or lower voltage duration than a preceding pulse.

15. A method according to claim 11, wherein the multi-bit cell is a dual bit cell comprising a first high resistance state, a second high resistance state, and a third high resistance state.

16. A method according to claim 11, wherein the applying one or more forward resetting voltage pulses across the RRAM cell and applying one or more reverse resetting voltage pulses across the RRAM cell forms an at least 10% narrower first range of resistance values for the first high resistance state, and an at least 10% narrower second range of resistance values for a second high resistance state, and an at least 10% narrower third range of resistance values for a third high resistance state.

17. A method according to claim 11, wherein the RRAM comprises a plurality of RRAM cells having a resistive switching medium comprising metal oxides.

18. A write verify method for resistance random access memory (RRAM), the method comprising:
    applying a reset operation voltage pulse across a RRAM cell, the reset operation voltage pulse changing a resistance of the RRAM cell from a low resistance state to a high resistance state and setting a counter to zero;
    applying a forward resetting voltage pulse across the RRAM cell if the RRAM cell has a high resistance state resistance value less than a selected lower resistance limit value and adding one to the counter, repeating the applying one or more forward resetting voltage pulses step until either the counter reaches a predetermined number or until the high resistance state resistance value is greater than the lower resistance limit value; and
    applying a reverse resetting voltage pulse across the RRAM cell if the RRAM cell has a high resistance state resistance values is greater than a selected upper resistance limit value and adding one to the counter, the reverse resetting voltage pulse having a second polarity being opposite the first polarity, repeating the applying one or more reverse resetting voltage pulses step until either the counter reaches a predetermined number or until all the high resistance state resistance value is less than the upper resistance limit value.

19. A method according to claim 18, wherein the applying a reverse resetting voltage pulse across the RRAM cell step occurs before the applying a forward resetting voltage pulse across the RRAM cell step.

20. A method according to claim 18, wherein each successive forward resetting voltage pulse and each successive reverse resetting voltage pulse has a lower voltage level than a preceding pulse.

* * * * *